United States Patent
Qin et al.

(10) Patent No.: US 11,269,381 B2
(45) Date of Patent: Mar. 8, 2022

(54) IRREGULAR SHAPED DISPLAY SCREENS AND DISPLAY DEVICES

(71) Applicant: Kunshan Go-Visionox Opto-Electronics Co., Ltd., Kunshan (CN)

(72) Inventors: Xu Qin, Kunshan (CN); Xiuqi Huang, Kunshan (CN); Tingting Zhang, Kunshan (CN); Lu Zhang, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 0 days.

(21) Appl. No.: 16/326,911

(22) PCT Filed: Sep. 7, 2018

(86) PCT No.: PCT/CN2018/104639
§ 371 (c)(1),
(2) Date: Feb. 20, 2019

(87) PCT Pub. No.: WO2019/218544
PCT Pub. Date: Nov. 21, 2019

(65) Prior Publication Data
US 2021/0349500 A1   Nov. 11, 2021

(30) Foreign Application Priority Data
May 14, 2018 (CN) .......................... 201810455765.2

(51) Int. Cl.
*G09G 3/20* (2006.01)
*G02F 1/1333* (2006.01)
(Continued)

(52) U.S. Cl.
CPC ............. *G06F 1/1656* (2013.01); *G09G 3/20* (2013.01); *G09G 2300/0426* (2013.01)

(58) Field of Classification Search
CPC ............. G02F 1/1345; G02F 1/13452; G09G 2300/0426
See application file for complete search history.

(56) References Cited

U.S. PATENT DOCUMENTS 5,270,693 A    12/1993  Wyler et al.
8,958,046 B2 *  2/2015  Shin .................. G02F 1/136286
                                                      349/151
(Continued)

FOREIGN PATENT DOCUMENTS

CN    103424901 A    12/2013
CN    103839516 A     6/2014
(Continued)

OTHER PUBLICATIONS

CN First Office Action dated Mar. 7, 2019 in the corresponding CN application(application No. 201810455765.2).
(Continued)

*Primary Examiner* — Sepehr Azari
(74) *Attorney, Agent, or Firm* — Kilpatrick Townsend & Stockton

(57) ABSTRACT

A display screen with an irregular shape is provided. The display screen with the irregular shape includes: an irregular-shaped display area including an irregular-shaped boundary and a pixel area, and the irregular-shaped boundary is located at a periphery of the pixel area; a packaging area provided at a periphery of the irregular-shaped boundary, the packaging is used to package the irregular-shaped display area; a number of connecting lines located between the irregular-shaped boundary and the packaging area, and the connecting lines are arranged along a direction from the irregular-shaped boundary to the packaging area. During
(Continued)

arranging the connecting lines, along the direction from the irregular-shaped boundary to the packaging area, the connecting lines are bent, such that the plurality of connecting lines are compactly arranged. A display device is also provided.

10 Claims, 4 Drawing Sheets

(51) Int. Cl.
*G02F 1/1345* (2006.01)
*G06F 1/16* (2006.01)

(56) References Cited

U.S. PATENT DOCUMENTS

| | | | |
|---|---|---|---|
| 9,514,673 B2 | 12/2016 | Kwon et al. | |
| 10,162,234 B2* | 12/2018 | Li | G02F 1/13452 |
| 10,248,238 B2* | 4/2019 | Abe | G06F 3/0445 |
| 10,475,389 B2* | 11/2019 | Kim | G09G 3/3233 |
| 10,475,873 B2* | 11/2019 | Matsueda | H01L 27/3276 |
| 10,559,644 B2* | 2/2020 | Lee | H01L 27/3248 |
| 10,861,403 B2* | 12/2020 | Shima | G02F 1/1362 |
| 2008/0012794 A1* | 1/2008 | Battersby | G02F 1/1345 |
| | | | 345/55 |
| 2008/0048934 A1* | 2/2008 | Yamamoto | G09G 3/3611 |
| | | | 345/55 |
| 2008/0266210 A1* | 10/2008 | Nonaka | G11C 19/28 |
| | | | 345/55 |
| 2012/0001835 A1* | 1/2012 | Yamamoto | G02F 1/13454 |
| | | | 345/55 |
| 2016/0190166 A1* | 6/2016 | Kim | H01L 27/1255 |
| | | | 257/71 |
| 2016/0240157 A1* | 8/2016 | Aoki | G09G 3/3666 |
| 2016/0247478 A1* | 8/2016 | Ishige | G09G 3/3677 |
| 2016/0291378 A1* | 10/2016 | Li | G02F 1/133308 |
| 2017/0221435 A1* | 8/2017 | Shima | G09G 3/3648 |
| 2018/0129106 A1* | 5/2018 | Gao | G09G 3/3611 |
| 2018/0158417 A1* | 6/2018 | Xiang | G09G 3/3233 |
| 2018/0166467 A1 | 6/2018 | Lai et al. | |
| 2018/0204889 A1* | 7/2018 | Yu | H01L 27/3223 |
| 2018/0204895 A1* | 7/2018 | Lin | H01L 27/3276 |
| 2018/0286316 A1 | 10/2018 | Yuki et al. | |
| 2018/0366066 A1* | 12/2018 | Kim | G09G 3/3677 |

FOREIGN PATENT DOCUMENTS

| | | |
|---|---|---|
| CN | 104332132 A | 2/2015 |
| CN | 107481669 A | 12/2017 |
| CN | 107561799 A | 1/2018 |
| CN | 108389516 A | 8/2018 |
| CN | 208271481 U | 12/2018 |
| JP | 2017003660 A | 1/2017 |
| WO | 2017043429 A1 | 3/2017 |

OTHER PUBLICATIONS

Office Actions of Chinese Patent Application No. 201810455765.2.
European Search Report of EP18918409.6.
International Search Report of PCT/CN2018/104639.
Rejection Decision of Chinese Patent Application No. 201810455765.2.
Office Actions of Taiwan Patent Application No. 107135645.
Office Actions of JP Patent Application No. 2019564854.

* cited by examiner

IRREGULAR SHAPED DISPLAY SCREENS AND DISPLAY DEVICES

CROSS-REFERENCE TO RELATED APPLICATIONS

This application is a U.S. national Stage of International Application No. PCT/CN2018/104639, filed on Sep. 7, 2018, designating the United States, which claims priority to Chinese Patent Application No. 201810455765.2, filed with the Chinese Patent Office on May 14, 2018 and entitled "DISPLAY SCREEN WITH IRREGULAR SHAPE AND DISPLAY DEVICE", the content of each of which is hereby incorporated by reference in its entirety.

FIELD

The present disclosure relates to the field of display, and particularly to irregular shaped display screens and a display devices.

BACKGROUND

At present, in the design process of the display panel, on the one hand, a high screen-to-body ratio is required, on the other hand, the necessary components such as the receiver and the camera cannot be removed. Therefore, it is necessary to form a groove on a portion of the display screen to meet the above requirements. As another example, the four corners of some display screens are arc angles. Compared with the display with a regular rectangular shape, a display screen body with a groove or arc angles is referred as a display screen with an irregular shape.

Display screens with irregular shapes have become a trend. Generally, the display screen with the irregular shape includes an irregular-shaped display area and a wiring area, and the wiring area is located at the periphery of the irregular-shaped display area. The scan lines, data lines or other compensation circuit connecting lines of the irregular-shaped display area are distributed in the wiring area. The scan lines, the data lines or other compensation circuit connecting lines are connected to the pixels of the corresponding rows of the irregular-shaped display area. Compared with the display area with regular shape, the wiring on the periphery of the irregular-shaped display area is more complicated and denser, so the occupied space is larger, such that the border corresponding to the irregular-shaped display area in the display screen with the irregular shape is difficult to realize a narrow border.

SUMMARY

Accordingly, the present disclosure provides a display screen with an irregular shape and a display device, which can realize a narrow border of the irregular-shaped display area of the display screen with the irregular shape.

The present disclosure provides a display screen with an irregular shape includes:

an irregular-shaped display area including an irregular-shaped boundary and a pixel area, the irregular-shaped boundary is located at a periphery of the pixel area;

a packaging area provided at a periphery of the irregular-shaped boundary, the packaging are is configured to package the irregular-shaped display area; and a plurality of connecting lines located between the irregular-shaped boundary and the packaging area, and the plurality of connecting lines are arranged along a direction from the irregular-shaped boundary to the packaging area.

Along a direction from the irregular-shaped boundary to the packaging area, each of the connecting lines is sequentially connected to a pixel of the pixel area. After one of the connecting lines adjacent to the irregular-shaped boundary is connected to the corresponding pixel, the remaining connecting lines are integrally bent towards the irregular-shaped boundary, such that the plurality of connecting lines are compactly wired and arranged integrally adjacent to the irregular-shaped boundary.

In one of the embodiments, the pixel area of the irregular-shaped display area includes two protrusion areas, and a groove is formed between the two protrusion areas; sides of the protrusion areas adjacent to the groove form the irregular-shaped boundary, and the irregular-shaped boundary is arched.

In one of the embodiments, the display screen with the irregular shape further includes a plurality of compensation loads, the compensation loads are provided on aside of the protrusion area, and the side where the compensation loads located is adjacent to the irregular-shaped boundary. Each of the connecting lines connects the compensation loads and the pixels corresponding to the protrusion areas.

In one of the embodiments, the pixels of the protrusion areas are arranged in rows and columns. Each of the compensation loads is connected to the pixels of the corresponding row of the protrusion areas via the corresponding connecting line. Along the direction from the irregular-shaped boundary to the packaging area, each of the connecting lines is sequentially connected to a pixel of the pixel area; after the connecting line most adjacent to the irregular-shaped boundary is connected to the corresponding pixel, the remaining connecting lines are integrally bent towards the irregular-shaped boundary, such that the plurality of connecting lines are compactly wired.

In one of the embodiments, the compensation loads are capacitors.

In one of the embodiments, the display screen with the irregular shape further includes a plurality of data signal units provided between the irregular-shaped boundary and the package area. The connecting lines includes a plurality of data lines located between the data signal units and the packaging area; each of the data signal units is connected to the corresponding pixel of the irregular-shaped display area via the corresponding data line; after one of the data lines adjacent to the irregular-shaped boundary is connected to the corresponding pixel, the remaining data lines are bent towards the irregular-shaped boundary, such that the plurality of data lines are compactly wired and arranged integrally adjacent to the irregular-shaped boundary.

In one of the embodiments, the display screen with the irregular shape further includes a plurality of driving circuit units. The connecting lines further include a plurality of scan lines, the plurality of driving circuit units are provided between the plurality of data lines and the packaging area; the plurality of scan lines are located between the plurality of data lines and the driving circuit units; each of the driving circuit units is connected to the corresponding pixel of the irregular-shaped display area via the corresponding scan line; after one of the scan lines adjacent to the packaging area is connected to the corresponding pixel, the remaining scan lines are bent towards the packaging area, such that the plurality of scan lines are compactly wired and arranged integrally adjacent to the packaging area.

In one of the embodiments, the irregular-shaped display area includes a sector display area, and the irregular-shaped boundary is an arc boundary of the sector display area.

In one of the embodiments, the display screen with the irregular shape further includes a plurality of data signal units provided between the irregular-shaped boundary and the package area. The connecting lines includes a plurality of data lines located between the data signal units and the packaging area; each of the data signal units is connected to the corresponding pixel of the sector display area via the corresponding data line; and after one of the data lines adjacent to the irregular-shaped boundary is connected to the corresponding pixel, the remaining data lines are integrally bent towards the irregular-shaped boundary, such that the plurality of data lines are wired compactly wired and arranged integrally adjacent to the irregular-shaped boundary.

In one of the embodiments, the display screen with the irregular shape further includes a plurality of driving circuit units. The connecting lines further include a plurality of scan lines, the plurality of driving circuit units are provided between the plurality of data lines and the packaging area; the plurality of scan lines are located between the plurality of data lines and the driving circuit units; each of the driving circuit units is connected to the corresponding pixel of the sector display area via the corresponding scan line; after one of the scan lines adjacent to the packaging area is connected to the corresponding pixel, the remaining scan lines are integrally bent towards the packaging area, such that the plurality of scan lines are compactly wired and arranged integrally adjacent to the packaging area.

In one of the embodiments, the display screen with the irregular shape further includes a cathode power line provided between the packaging area and the plurality of connecting lines.

The present disclosure further provides a display device including the display screen with the irregular shape of any one of the aforementioned embodiments.

In the aforementioned display screen with the irregular shape and the display device, a plurality of connecting lines are located between the irregular-shaped boundary and the packaging area, and the plurality of connecting lines are arranged one by one along a direction from the irregular-shaped boundary to the packaging area. In the process of wiring the plurality of connecting lines, after one connecting line adjacent to the irregular-shaped boundary is connected to the corresponding pixel, the remaining connecting lines are integrally bent towards the irregular-shaped boundary, such that the plurality of connecting lines are compactly wired and arranged integrally adjacent to the irregular-shaped boundary. On the one hand, the wiring space occupied by the plurality of connecting lines is reduced. Since the area occupied by the plurality of connecting lines corresponds to at least a portion of the frame of the irregular-shaped display area, reducing the wiring space occupied by the plurality of connecting lines makes the frame of the irregular-shaped display area narrower, thereby achieving the narrowing of the frame of the irregular-shaped display area. On the other hand, since the connecting lines are integrally arranged more adjacent to the irregular-shaped boundary, other lines may also be provided between the packaging area and the plurality of connecting lines while narrowing the frame, so as to facilitate the wiring of other related lines of the display screen with the irregular shape.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE INVENTION

The specific embodiments of the present disclosure will be described in detail below with reference to the accompanying drawings.

Figure 1:
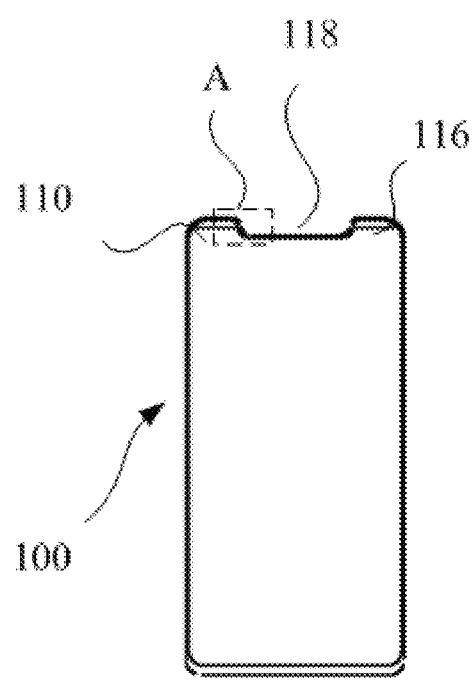
FIG. 1 is a schematic view of display screen with an irregular shape according to an embodiment.
Figure 2:
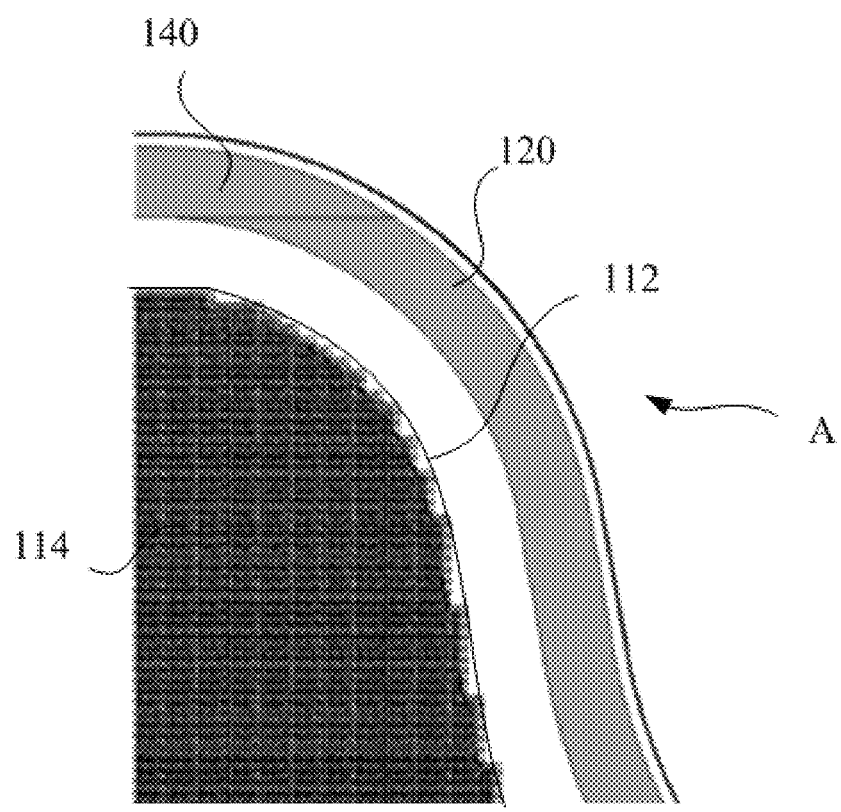
FIG. 2 is a partial enlarged view of the portion A in FIG. 1.
Figure 3:
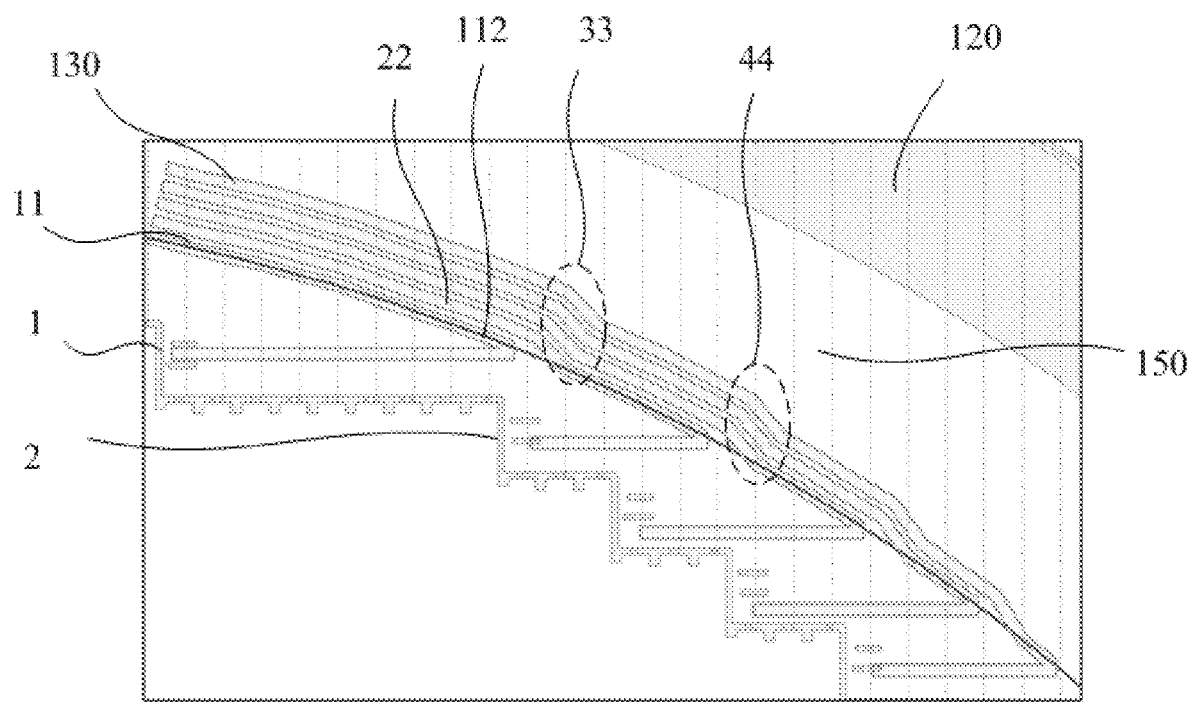
FIG. 3 is a schematic view of wiring of the connecting lines of the display screen with the irregular shape of FIG. 1.

FIG. 1 is a schematic view of display screen 100 with an irregular shape according to an embodiment. FIG. 2 is a partial enlarged view of the portion A in FIG. 1. FIG. 3 is a schematic view of wiring of the connecting lines of the display screen with the irregular shape of FIG. 1. As shown in FIG. 1 to FIG. 3, the display screen 100 with the irregular shape includes a substrate (not shown), an irregular-shaped display area 110, a packaging area 120 and a plurality of connecting lines 130. The irregular-shaped display area 110, the plurality of connecting lines 130, and the packaging area 120 are all provided on the substrate.

The irregular-shaped display area 110 includes an irregular-shaped boundary 112 and a pixel area 114, the irregular-shaped boundary 112 is located at a periphery of the pixel area 114. The irregular-shaped boundary 112 is a boundary between the pixel area 114 and an outside area. A projection of the irregular-shaped boundary 112 on the plane of the irregular-shaped display area 110 may have a circular arc shape or a shape of other curved segments. The shape of the irregular-shaped boundary 112 depends on the shape of the irregular-shaped display area 110. The pixel area includes a plurality of pixels for displaying. Generally, the plurality of pixel are arranged in rows and columns.

The packaging area 120 is provided at a periphery of the irregular-shaped boundary 112. The packaging area 120 is used to package the irregular display area 110.

The plurality of connecting lines 130 are located between the irregular-shaped boundary 112 and the packaging area 120. The plurality of connecting lines 130 are arranged one by one along the direction from the irregular-shaped boundary 112 to the packaging area 120. Along the direction from the irregular-shaped boundary 112 to the packaging area 120, each of the connecting lines is sequentially connected to a pixel of the pixel area 114. After one of the connecting lines adjacent to the irregular-shaped boundary 112 is connected to the corresponding pixel, the remaining connecting lines are integrally bent towards the irregular-shaped boundary 112, such that the plurality of connecting lines are compactly wired and arranged integrally adjacent to the irregular-shaped boundary.

In the aforementioned display screen 100 with the irregular shape, the plurality of connecting lines 130 are located between the irregular-shaped boundary 112 and the packaging area 120, and the plurality of connecting lines 130 are arranged one by one along a direction from the irregular-shaped boundary 112 to the packaging area 120. After one connecting line 130 adjacent to the irregular-shaped boundary 112 is connected to the corresponding pixel, the remaining connecting lines 130 are integrally bent towards the irregular-shaped boundary 112, such that the plurality of connecting lines 130 are compactly wired and arranged integrally adjacent to the irregular-shaped boundary 112. On the one hand, the wiring space occupied by the plurality of connecting lines 130 is reduced. Since the area occupied by the plurality of connecting lines 130 corresponds to the frame of the irregular-shaped display area 110, reducing the wiring space occupied by the plurality of connecting lines 130 makes the frame of the irregular-shaped display area 110 narrower, thereby achieving the narrowing of the frame of the irregular-shaped display area 110. On the other hand, since the connecting lines 130 are integrally arranged more adjacent to the irregular-shaped boundary 112, other lines may also be provided between the packaging area 120 and the plurality of connecting lines 130 while narrowing the frame, so as to facilitate the wiring of other related lines of the display screen 100 with the irregular shape.

As shown in FIG. 1, the pixel area of the irregular-shaped display area 110 includes two adjacent protrusion areas 116, and a groove 118 is formed between the two protrusion areas 116. A position corresponding to the groove 118 may be used to accommodative an auxiliary device such as a receiver or a camera.

The irregular-shaped boundary 112 is formed by sides of the protrusion areas 116 adjacent to the groove 118, and the irregular-shaped boundary 112 is arched. That is to say, as observed from a direction perpendicular to the irregular-shaped display area 110, the sides of the protrusion areas 116 adjacent to the groove 118 have arc shapes, and the irregular-shaped boundary 112 is formed by the sides of the arc shapes. The pixels of the protrusion areas 116 are arranged in rows and columns. However, since the shapes of the protrusion areas 116 are not regular rectangles, the pixels thereof are not arranged in arrays, that is, the number of pixels in each row is different.

As shown in FIG. 2, the display screen 100 with the irregular shape further includes a plurality of compensation loads 140. The compensation loads 140 are provided on a side of the protrusion area 116, and the side where the compensation load 140 located is adjacent to the irregular-shaped boundary 112. Tops of two protrusion areas 116 are both provided with the compensation load 140. Compared with the display screen having a regular rectangular shape, each of the compensation loads 140 is used to compensate the corresponding pixels lacked in the position corresponding to the groove 118, such that the display screen 100 with the irregular shape can still use the driving circuit corresponding to the display screen with regular shape. The display screen with regular shape herein means a conventional display screen with a rectangular shape. In addition, the compensation loads 140 are capacitors. Therefore, for the display screen 100 with the irregular shape, the driving circuit is not required to be redesigned, which reduces the production cost of the display screen 100 with the irregular shape.

Referring to FIG. 1, FIG. 2, and FIG. 3, each of the connecting lines is used to connect the compensation loads 140 and the pixels corresponding to the protrusion areas 116. That is, each of the compensation load 140 is connected to pixels in a row corresponding to the protrusion areas 116. During the wiring of the connecting lines, along the direction from the irregular-shaped boundary 112 to the packaging area 120, each of the connecting lines is sequentially connected to a pixel of the pixel area 114. After the connecting line most adjacent to the irregular-shaped boundary 112 is connected to the corresponding pixel, the remaining connecting lines are sequentially bent towards the irregular-shaped boundary 112, such that the plurality of connecting lines 130 are compactly arranged.

Specifically, as shown in FIG. 3, since the compensation load 140 is located at the top of the protrusion area 116, the plurality of connecting lines are arranged along the irregular-shaped boundary 112 from the top of the protrusion area to the bottom of the groove 118. Correspondingly, among the pixels of the protrusion area 116, the pixels of the row closest to the top of the protrusion area 116 is defined as the first row of pixels 1, and the pixels of the row closest to the bottom of the groove 118 is defined as the last row of pixels, the rows of pixels between the first row of pixels 1 and the last row of pixels are sequentially ordered. The plurality of connecting lines 130 are located one by one between the irregular-shaped boundary 112 and the packaging area 120. In a direction perpendicular to the connecting lines, the connecting line most adjacent to the irregular-shaped boundary 112 is defined as the first connecting line 11, and the connecting line most away from the irregular-shaped boundary 112 is the last connecting line, the connecting lines between the first connecting line 11 and the last connecting line are sequentially ordered. The connecting line most adjacent to the irregular-shaped boundary 112 is first connected to the pixels of the protrusion area 116. In other words, the first connecting line 11 is first connected to the first row of pixels 1. Thereafter, the remaining connecting lines are integrally bent towards the irregular-shaped boundary 112, that is, the remaining connecting lines are as close as possible to the irregular-shaped boundary 112. As shown in FIG. 3, after the first connecting line 11 is connected to the first row of pixels 1, the remaining connecting lines are integrally bent towards the irregular-shaped boundary 112 and form a first bending area 33. After the second connecting line 22 is connected to a second row of pixels 2 of the protrusion area 116, the remaining connecting lines are bent as close as possible to the irregular-shaped boundary 112. The remaining connecting lines are similarly arranged. As shown in FIG. 3, after the second connecting line 22 is connected to the second row of pixels 2, the remaining connecting lines are bent towards the irregular-shaped boundary 112 and form a second bending area 44. The remaining connecting lines are similarly arranged. In this way, the connecting lines 130 are compactly arranged, so as to save the space.

For example, as shown in FIG. 3, in a display screen 100 with an irregular shape according to an embodiment, according to testing, when the distance between the packaging area 120 and the irregular-shaped boundary 112 is constant, according to the conventional wiring manner, the distance between the plurality of connecting lines 130 and the packaging area 120 is only 154 µm. While for the same display screen 100 with the irregular shape, if the plurality of connecting lines 130 are arranged based on the wiring method of the present disclosure, the distance between the plurality of connecting lines 130 and the packaging area 120 can be 279 µm. This fully demonstrates that in the display screen 100 with the irregular shape of the present embodiment, the plurality of connecting lines 130 occupy a less space. Therefore, the distance between the packaging area 120 and the irregular-shaped boundary 112 can be reduced within an allowable range, that is, the frame of the irregular-shaped display area can be made narrower. Alternatively, other lines may be provided between the packaging area 120 and the plurality of connecting lines 130 while making the frame of irregular-shaped display area narrower.

As shown in FIG. 3, the display screen 100 with the irregular shape further includes a cathode power line. The cathode power line is provided on a cathode wiring area 150 of the substrate, and the cathode wiring area 150 is provided between the packaging area 120 and the plurality of connecting lines. Specifically, since the plurality of connecting lines 130 are compactly arranged and occupy a less space, the cathode power line can have sufficient wiring space between the plurality of connecting lines 130 and the packaging area 120. Since the cathode power line can be provided between the plurality of connecting lines 130 and the packaging area 120, the cathode power line is easy to be arranged.

Figure 4:
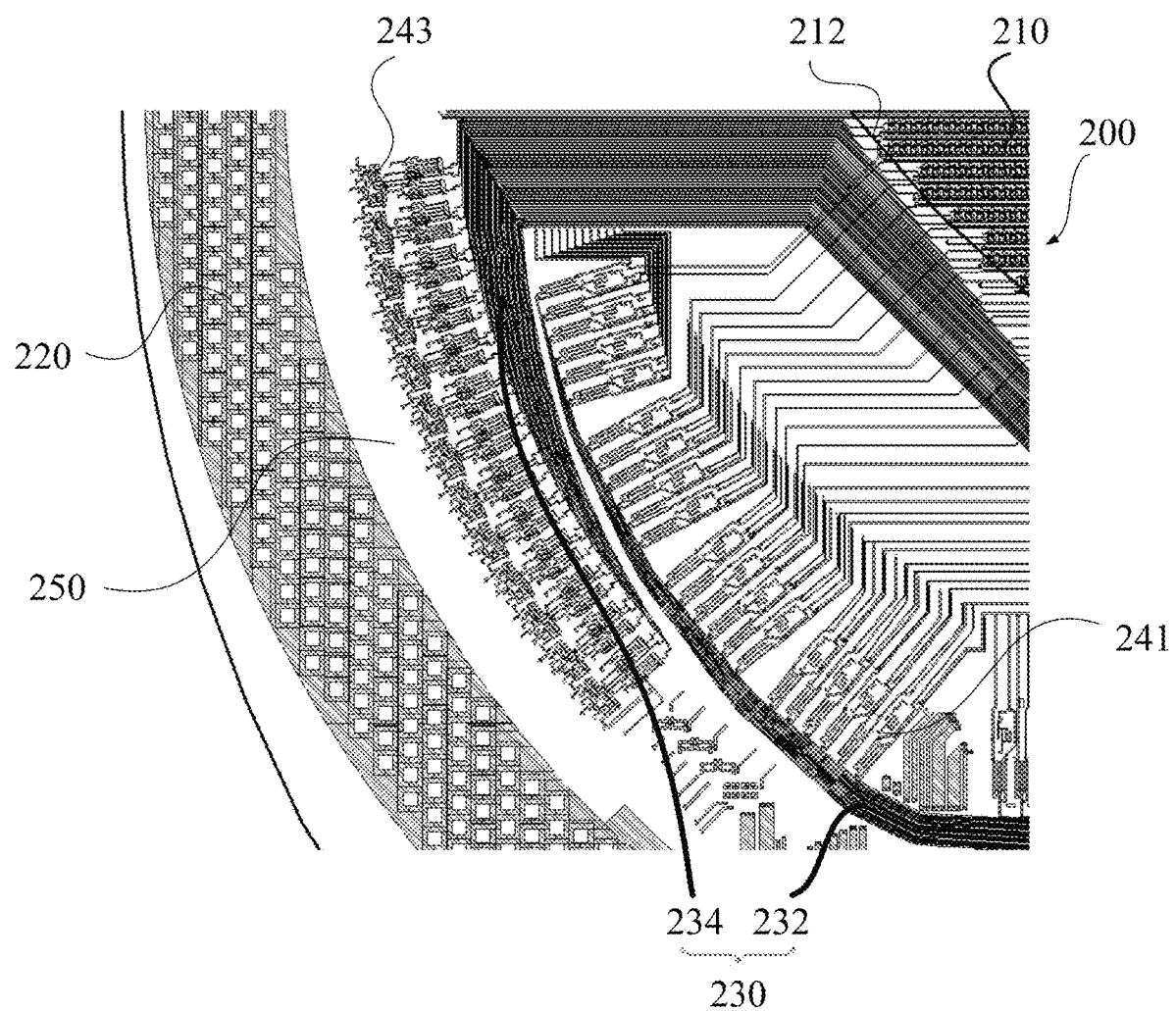
FIG. 4 is a schematic view of display screen with an irregular shape according to another embodiment.

FIG. 4 is a schematic view of a display screen with an irregular shape according to another embodiment. As shown in FIG. 4, the irregular-shaped display area includes a sector display area 210, and the irregular-shaped boundary 212 is an arc boundary of the sector display area 210. Similar to the aforementioned protrusion areas, the pixels of the sector display area 210 are also arranged in rows and columns.

As shown in FIG. 4, the display screen 200 with an irregular shape further includes a plurality of data signal units 241 provided between the irregular-shaped boundary 212 and the package area 220. The data signal units 241 could also be called as data signal circuits. The plurality of data signal units 241 form a scanning circuit of the display screen 200 with the irregular shape. The connecting lines include data lines 232. The plurality of data lines 232 are located between the data signal units 241 and the packaging area 220. Each of the data signal units 241 is connected to the corresponding pixel of the sector display area 210 via the corresponding data line 232. After one of the data lines 232 adjacent to the irregular-shaped boundary 212 is connected to the corresponding pixel, the remaining data lines 232 are integrally bent towards the irregular-shaped boundary 212, such that the plurality of data lines 232 are compactly wired and arranged integrally adjacent to the irregular-shaped boundary 212, thereby saving the space.

Referring to FIG. 4, the data signal units 241 are sorted from bottom to top, the bottommost one is the first data signal unit 241, the topmost one is the last data signal unit 241, and the data signal units 241 between the first data signal unit 241 and the last data signal unit 241 are sequentially ordered. In a direction perpendicular to the data lines 232, the data line 232 most adjacent to the first data signal unit 241 is the first data line 232. Correspondingly, in a direction perpendicular to the first data line 232, the data line 232 furthest away from the first data line 232 is the last data line 232, the data lines 232 between the first data line 232 and the last data line 232 are sequentially ordered. During wiring the data lines 232, the data lines 232 are arranged from bottom to top. The first data line 232 is connected to the first data signal unit 241 and the corresponding pixels of the sector display area 210. The remaining data lines 232 and the corresponding data signal units 241 are connected in similar manners. For example, the second data line 232 is connected to the second data signal unit 241. After the first data line 232 is connected to the first data signal unit 241, the remaining data lines 232 are integrally bent towards the irregular-shaped boundary 212. After the second data line 232 is connected to the second data signal unit 241, the remaining data lines 232 are integrally bent towards the irregular-shaped boundary 212. Remaining data lines 232 are bent similarly, until the last data line 232 is connected to the last data signal unit 241. In this way, all the data lines 232 are compactly arranged, thereby saving the space.

As shown in FIG. 4, the display screen 200 with the irregular shape further includes a plurality of driving circuit units 243. The driving circuit units 243 could also be called as driving circuits. The connecting lines further include a plurality of scan lines 234. The plurality of driving circuit units 243 are provided between the plurality of data lines 232 and the packaging area 220. The plurality of driving circuit units 243 form a driving circuit of the display screen 200 with the irregular shape. The plurality of scan lines 234 are located between the plurality of data lines 232 and the driving circuit units 243. Each of the driving circuit units 243 is connected to the pixel of the sector display area 210 via the corresponding scan line 234. After one scan line 234 adjacent to the packaging area 220 is connected to the corresponding pixels, the remaining scan lines 234 are integrally bent towards the packaging area 220, such that the plurality of scan lines 234 are compactly wired and arranged integrally adjacent to the packaging area 220, thereby saving the space.

Specifically, referring to FIG. 4, the driving circuit units 243 are sorted from top to bottom, the topmost one is the first driving circuit unit 243, the bottommost one is the last driving circuit unit 243, and the driving circuit units 243 between the first driving circuit unit 243 and the last driving circuit unit 243 are sequentially ordered. In a direction perpendicular to the scan lines 234, the scan line 234 most adjacent to the first driving circuit unit 243 is the first scan line 234. Correspondingly, in a direction perpendicular to the first scan line 234, the scan line 234 furthest away from the first scan line 234 is the last scan line 234, the scan lines 234 between the first scan line 234 and the last scan line 234 are sequentially ordered. During wiring the scan lines 234, the scan lines 234 are arranged from top to bottom. The first scan line 234 is connected to the first driving circuit unit 243 and the corresponding pixels of the sector display area 210. The remaining scan lines 234 are connected in similar manners. For example, the second scan line 234 is connected the second driving circuit unit 243. After the first scan line 234 is connected the first driving circuit unit 243, the remaining scan lines 234 are integrally bent towards the packaging area 220. That is, the remaining scan lines are sequentially bent towards the driving circuit units 243. After the second scan line 234 is connected the second driving circuit unit 243, the remaining scan lines 234 are integrally bent towards the packaging area 220. The remaining scan lines 234 are bent similarly, until the last scan line 234 is connected to the last driving circuit unit 243. In this way, all the scan lines 234 are compactly arranged, thereby saving the space.

As shown in FIG. 4, the wiring of the plurality of scan lines 234 and the plurality of data lines 232 allows the scan lines 234 and the data lines 232 to save space, respectively. The plurality of scan lines 234 are more adjacent to the driving circuit units 243, and the plurality of data lines 232 are more adjacent to the data signal units 241, thereby increasing the gap between the plurality of scan lines 234 and the plurality of data lines 232. Therefore, during designing the scan lines 234 and the data lines 232, the plurality of scan lines 234 and the plurality of data lines 232 can be more adjacent to each other, thereby decreasing the overall space occupied by the scan lines 234 and the data lines 232. In this way, the scanning circuit and the driving circuit can be integrally more adjacent to the sector display area 210, such that the space between the driving circuit and the packaging area 220 is increased.

Therefore, the distance from the packaging area 220 to the irregular-shaped boundary 212 can be reduced within an allowable range, thereby narrowing the frame of the display screen 200 with the irregular shape. In addition to narrowing the frame, other lines may also be provided between the packaging area 220 and the driving circuit. For example, a cathode wiring area 250 can be provided between the driving circuit and the packaging area 220, cathode power line can be provided on the cathode wiring area 250, such that the cathode power line can be easily arranged.

It should be noted that, in the aforementioned display screen 200 with the irregular shape, the compensation load, data signal unit 241, and the driving circuit unit 243 are only used as examples to illustrate the wiring structure of the plurality of connecting lines 230. In fact, the wiring structure of the plurality of connecting lines 230 can be applied in circuits of any display screens 200 with irregular shapes.

The present disclosure further provides a display device including the display screen with the irregular shape of any one of the aforementioned embodiments. In this way, the frame of the display screen of the display device can be narrower.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

The invention claimed is:

1. A display screen with an irregular shape, comprising: an irregular-shaped display area comprising an irregular-shaped boundary and a pixel area, the irregular-shaped boundary being located at a periphery of the pixel area; a packaging area located at a periphery of the irregular-shaped boundary, the packaging area packaging the irregular-shaped display area; and a plurality of connecting lines located between the irregular-shaped boundary and the packaging area, the plurality of connecting lines being arranged along a direction from the irregular-shaped boundary to the packaging area; wherein along the direction from the irregular-shaped boundary to the packaging area, each of the connecting lines is sequentially connected to a pixel of the pixel area, and after one of the connecting lines adjacent to the irregular-shaped boundary is connected to the corresponding pixel, the remaining connecting lines are bent towards the irregular-shaped boundary, the plurality of connecting lines is characterized by a narrowing shape toward a predetermined direction along a contour of the irregularly-shaped boundary, wherein the irregular-shaped display area comprises a sector display area, and the irregular-shaped boundary is an arc boundary of the sector display area; and further comprising a plurality of data signal units provided between the irregular-shaped boundary and the package area; wherein the connecting lines comprise a plurality of data lines located between the data signal units and the packaging area; each of the data signal units is connected to the corresponding pixel of the sector display area via the corresponding data line; and after one of the data lines adjacent to the irregular-shaped boundary is connected to the corresponding pixel, the remaining data lines are integrally bent towards the irregular-shaped boundary forming a first tapered region; and further comprising a plurality of driving circuit units, the connecting lines further comprising a plurality of scan lines, the plurality of driving circuit units being provided between the plurality of data lines and the packaging area; the plurality of scan lines being located between the plurality of data lines and the driving circuit units; wherein each of the driving circuit units is connected to the pixel of the sector display area via the corresponding scan line; and after one of the scan lines adjacent to the packaging area is connected to the corresponding pixel, the remaining scan lines are bent towards the packaging area forming a second tapered region; wherein a gap is formed between the first tapered region and the second tapered region.

2. The display screen with the irregular shape according to claim 1, wherein the pixel area of the irregular-shaped display area comprises two protrusion areas and a groove is formed between the two protrusion areas, the irregular-shaped boundary is formed by sides of the protrusion areas adjacent to the groove, and the irregular-shaped boundary is arched.

3. The display screen with the irregular shape according to claim 2, further comprising a plurality of compensation loads provided on a side of the protrusion area, the side where the compensation loads is located being adjacent to the irregular-shaped boundary; wherein each of the connecting lines connects the compensation loads and the pixels corresponding to the protrusion areas.

4. The display screen with the irregular shape according to claim 3, wherein the pixels of the protrusion areas are arranged in rows and columns, and each of the compensation loads is connected to the pixels of the corresponding row of the protrusion areas via the corresponding connecting line.

5. The display screen with the irregular shape according to claim 3, wherein the compensation loads are capacitors.

6. The display screen with the irregular shape according to claim 3, wherein the plurality of compensation loads is disposed on a top side of the protrusion area.

7. The display screen with the irregular shape according to claim 1, further comprising a plurality of data signal units provided between the irregular-shaped boundary and the package area; wherein the connecting lines comprise a plurality of data lines located between the data signal units and the packaging area, each of the data signal units is connected to the corresponding pixel of the irregular-shaped display area via the corresponding data line, and after one of the data lines adjacent to the irregular-shaped boundary is connected to the corresponding pixel, the remaining data lines are bent towards the irregular-shaped boundary.

8. The display screen with the irregular shape according to claim 7, further comprising a plurality of driving circuit units, and the connecting lines further comprising a plurality of scan lines, the plurality of driving circuit units being provided between the plurality of data lines and the packaging area; the plurality of scan lines being located between the plurality of data lines and the driving circuit units; wherein each of the driving circuit units is connected to the corresponding pixel of the irregular-shaped display area via the corresponding scan line; and after one of the scan lines adjacent to the packaging area is connected to the corresponding pixel, the remaining scan lines are bent towards the packaging area.

9. The display screen with the irregular shape according to claim 1, further comprising a cathode power line provided between the packaging area and the plurality of connecting lines.

10. A display device, comprising a display screen with the irregular shape of claim 1.

* * * * *